United States Patent [19]

Wagner, Jr. et al.

[11] Patent Number: 5,672,383
[45] Date of Patent: Sep. 30, 1997

[54] BARRIER FILMS HAVING CARBON-COATED HIGH ENERGY SURFACES

[75] Inventors: John R. Wagner, Jr., Rochester; Eldridge M. Mount, III, Fairport, both of N.Y.

[73] Assignee: Mobil Oil Corporation, Fairfax, Va.

[21] Appl. No.: 528,803

[22] Filed: Sep. 15, 1995

Related U.S. Application Data

[62] Division of Ser. No. 221,620, Apr. 1, 1994, abandoned.
[51] Int. Cl.$^6$ ........................................................ B05D 3/04
[52] U.S. Cl. .................... 427/228; 427/249; 427/255.1; 427/255.2; 427/255.6; 427/577; 427/585; 428/474.9; 428/475.2; 428/475.5; 428/476.1
[58] Field of Search ................................ 427/577, 585, 427/249, 255.1, 255.2, 255.6, 228

[56] References Cited

U.S. PATENT DOCUMENTS

| | | | |
|---|---|---|---|
| 3,663,265 | 5/1972 | Lee et al. | |
| 4,365,587 | 12/1982 | Hirose et al. | |
| 4,633,183 | 12/1986 | Ovshinsky et al. | 427/39 |
| 4,675,206 | 6/1987 | Ikegaya et al. | 427/38 |
| 4,756,964 | 7/1988 | Kincaid et al. | 428/408 |
| 4,824,699 | 4/1989 | Woo et al. | 427/307 |
| 4,826,955 | 5/1989 | Akkapeddi et al. | 528/324 |
| 4,863,549 | 9/1989 | Grünwald | 156/345 |
| 4,902,378 | 2/1990 | Ouderkirk et al. | 156/643 |
| 4,911,963 | 3/1990 | Lustig et al. | 428/36.91 |
| 5,000,831 | 3/1991 | Osawa et al. | 204/173 |
| 5,041,201 | 8/1991 | Yamazaki et al. | 204/192.32 |
| 5,079,033 | 1/1992 | Schulz et al. | 427/44 |
| 5,137,780 | 8/1992 | Nichols et al. | 428/336 |
| 5,175,238 | 12/1992 | Matlack et al. | 528/339 |
| 5,230,931 | 7/1993 | Yamazaki et al. | 427/569 |

*Primary Examiner*—Ana Woodward
*Attorney, Agent, or Firm*—Dennis P. Santini

[57] ABSTRACT

A carbon coated polymeric film is produced by Plasma Enhanced Chemical Vapor Deposition. An amorphous nylon layer having at least one exposed high energy surface is adhered to a polymeric substrate. Carbon is thereafter deposited on the exposed high energy surface by vapor deposition of a decomposable precursor in the presence of plasma.

11 Claims, No Drawings

BARRIER FILMS HAVING CARBON-COATED HIGH ENERGY SURFACES

This application is a divisional of application Ser. No. 08/221,620 filed on Apr. 1, 1994 now abandoned.

BACKGROUND OF THE INVENTION

The present invention relates to barrier films and, in particular, to barrier films having at least one exposed high energy surface for receipt of a carbon coating.

Carbon coatings are known to provide certain barrier characteristics. For example, a carbon coating can inhibit the transmission of elements such as water and oxygen. Accordingly, carbon coatings are commonly applied to substrates (e.g., polymeric films), which otherwise would not possess these barrier characteristics. Films having such carbon coatings are often referred to as barrier films.

Carbon coatings can be deposited on substrates through various techniques. One preferred technique is Plasma Enhanced Chemical Vapor Deposition (PECVD), which allows carbon to be deposited on low-temperature substrates such as polymeric films. Particularly, this technique allows the deposition of carbon at lower reaction chamber temperatures, as compared to the reaction chamber temperatures required in other deposition processes. As a result, the lower reaction chamber temperature allows carbon to be deposited on low-temperature substrates.

The PECVD process is, however, a relatively slow and lengthy process, which in many cases renders such technique commercially impracticable. Accordingly, there exists a need in the art for a method which increases the rate of production of a PECVD barrier film, while at the same time maintaining the desirable barrier properties of a carbon-coated substrate.

SUMMARY OF THE INVENTION

The present invention, which addresses the needs of the prior art, provides a method for producing a polymeric film having barrier characteristics. The method includes the step of depositing a carbon coating on an exposed high energy surface of an amorphous nylon layer by vapor deposition of a decomposable precursor in the presence of plasma.

Preferably, the amorphous nylon layer is adhered to a polymeric substrate. Carbon is thereafter deposited on the exposed high energy surface by PECVD, preferably under dual frequency conditions.

The method preferably includes the step of applying a primary frequency of about 13.5 MHz to a first electrode positioned in a reaction chamber to generate the plasma and a secondary frequency of about 90kHz to about 450 kHz to a second electrode positioned in the chamber to facilitate deposition of the carbon coating on the exposed high energy surface.

The present invention also provides a method for increasing the production rate of a barrier film. The method includes the step of adhering an amorphous nylon layer having at least one exposed high energy surface to a polymeric substrate. The method includes the additional step of depositing a carbon coating on the exposed high energy surface by vapor deposition of a decomposable precursor in the presence of plasma.

The present invention also provides a polymeric film having barrier characteristics. The film is produced by the process of depositing a carbon coating on an exposed high energy surface of an amorphous nylon layer by vapor deposition of a decomposable precursor in the presence of plasma. The amorphous nylon layer is preferably adhered to a polymeric substrate.

As a result of the present invention, the time required to produce a carbon coated polymeric film is greatly reduced, thereby increasing the commercial practicality of PECVD techniques. Moreover, the resultant films provide an improved barrier to the transmission of oxygen and water.

DETAILED DESCRIPTION OF THE INVENTION

In accordance with the present invention, a method is provided for producing a polymeric film having barrier characteristics. The method includes the step of depositing a carbon coating on an exposed high energy surface of a polymeric layer by vapor deposition of a decomposable precursor in the presence of plasma.

In one preferred embodiment, a layer of amorphous nylon is adhered to a polymeric substrate. The exposed surface of the nylon layer provides the aforementioned high energy surface. It is this high energy surface that receives the deposited carbon.

The amorphous nylon layer may be adhered to the substrate by a variety of techniques known in the art. For example, the nylon layer may be laminated onto a polymeric substrate by use of an adhesive. One particularly preferred method of securing a nylon layer to a polymeric substrate is accomplished by co-extruding a polymeric material with amorphous nylon, thereby providing a polymeric substrate having a layer of amorphous nylon on at least one side. Typically, a tie layer is employed to adhere the amorphous nylon to the polymeric substrate. For example, a material such as malic anhydride modified polypropylene can be employed as the tie layer. One such commercially available product is Atmer QF-500A.

The amorphous nylon employed in the present invention is preferably an amorphous co-polyamide based on hexamethylenediamine and a mixture of isophthalic and terephthalic acids. One such commercially available product is Dupont PA-3426.

The amorphous nylon layer provides a high energy surface, which is believed to facilitate the adhesion of deposited carbon thereto. Particularly, the exposed surface of the amorphous nylon exhibits a high "wettability" compared to other polymers. Wettability is believed to affect the ability of materials to intimately contact one another. In this regard, it has been demonstrated herein that the application of a polymeric layer having a high energy surface (such as amorphous nylon) to a polymeric substrate greatly reduces the time required to deposit a carbon coating via PECVD. It is therefore contemplated that other polymers exhibiting a similar wettability would also be effective in providing a high energy surface for receipt of a carbon coating.

Examples of polymeric substrates contemplated in the present invention include polypropylene, polyethylene, biaxial nylon and polyester. However, it is believed that other substrates, as long as such substrates are compatible with the material exhibiting the high energy surface, could be employed in the present invention.

The present invention also provides a method for increasing the production rate of a barrier film. The method includes the steps of adhering a polymeric layer having at least one exposed high energy surface to a polymeric substrate and, thereafter depositing a carbon coating on the exposed high energy surface by vapor deposition of a decomposable precursor in the presence of plasma. Again, this polymeric layer is preferably amorphous nylon.

As described earlier, the carbon coating is formed by the deposition of a decomposable precursor. A hydrocarbon gas having from about 1 to 20 carbon atoms is used as the decomposable precursor. Acetylene is one such preferred precursor gas.

Upon the introduction of the decomposable precursor to the plasma, the precursor gas decomposes and is thereafter deposited on the exposed high energy surface as an amorphous carbon layer. This carbon coatings may range in thickness from 10 to 5000 angstroms. The thickness of the amorphous carbon coatings will be primarily dependent on the amount of time allowed for deposition.

The plasma in the present invention is generated by the application of a primary radio frequency to a first electrode. This radio frequency excites the gas mixture flowing through the chamber, thereby forming a plasma. This gas mixture is preferably a mixture of the precursor gas mentioned above, e.g., acetylene, and an inert gas such as argon.

Apparatuses adapted for PECVD are commercially available. Such apparatuses generally include a chamber sized for receipt of a substrate. The apparatus additionally includes a vacuum pump for evacuating the chamber, means for introducing a gas mixture to the chamber under controlled conditions, and means for generating a plasma within the chamber.

In one particularly preferred embodiment, the plasma generation means includes distally spaced first and second electrodes, which together can be employed to introduce independent dual energy sources into the reaction chamber. A primary radio frequency of about 13.56 MHz is applied to the first electrode and a secondary radio frequency of about between 90 KHz to 450 KHz is applied to the second electrode. Preferably, the chamber serves as the ground for both radio frequencies.

The primary frequency generates the plasma (by exciting the gas mixture), while the secondary frequency is believed to facilitate the deposition of the carbon on the high energy surface by exciting the carbon molecules being deposited. This rationale is supported by the fact that a visible change in the plasma is observed upon application of this second radio frequency.

Other means of generating the plasma are also contemplated. For example, a primary radio frequency of about 2.45 GHz could be applied across the electrodes. In addition, lasers or magnetic fields could be employed to excite the gas mixture.

The chamber also includes a substrate holder plate for supporting the polymeric substrate to be coated. This substrate holder plate is preferably integral with the second electrode. In addition, the substrate holder plate may include either a flat or an arcuate support surface. It is contemplated that the use of an arcuate support surface would facilitate commercial production of the present invention.

EXAMPLE 1

Two control films were produced. A 1 mil thick oriented polypropylene film approximately 11" long by 15.5" wide was placed on a 10" long by 15.5" wide substrate holder plate attached to the second electrode. The substrate holder plate included an arcuate surface having a 40" radius of curvature. The film overhung the substrate holder plate along the length of such film to allow the film to be secured to the holder.

The chamber was pumped down to about 1 mTorr. An acetylene/argon gas mixture was then introduced into the chamber at a flow rate of 100 sccm, 70% of the mixture being acetylene. The pressure within the chamber was increased to a reaction pressure of about 100 mTorr by use of a gate valve located at the inlet of the vacuum pump. A primary frequency of 13.5 MHz at a power level of 100 watts was applied to the first electrode and a secondary frequency of 95 kHz at a power level of 25 watts was applied to the second electrode.

The substrate was coated for approximately 300 seconds. Thereafter, the gas mixture was shut off and the chamber was pumped down again to about 1 mTorr. The chamber vacuum was then broken by bleeding in dry nitrogen gas and the respective coated substrate was removed.

The two control films were thereafter tested. The first control film exhibited an oxygen transmission rate ($TO_2$) of 0.4 cc $O_2$/100 $in^2$/atm/24 hr at 23° C. and 0% relative humidity and a water vapor transmission rate (WVTR) of 0.02 g $H_2O$/100 $in^2$ atm/24 hr at 100° F. and 90% relative humidity. The second control film exhibited an oxygen transmission rate of 0.6 cc $O_2$/100 $in^2$ atm/24 hr at 23° C. and 0% relative humidity and a water vapor transmission rate of 0.09 g $H_2O$/ 100 $in^2$/atm/24 hr at 100° F. and 90% relative humidity.

Accordingly, the average control oxygen transmission rate was 0.5 cc $O_2$/ 100 $in^2$/atm/24 hr at 23° C. and 0% relative humidity and the average control water vapor transmission rate was 0.055 g $H_2O$/100 $in^2$/atm/24 hr at 100° F. and 90% relative humidity.

EXAMPLE 2

Barrier films in accordance with the present invention were produced by co-extruding amorphous nylon with polypropylene into a base sheet that was subsequently biaxially oriented. Resin pellets of Dupont nylon PA-3426 were employed, along with a tie layer of Atmer QF-500A. The oriented film was approximately 1 mil thick, the amorphous nylon layer representing approximately 6% or 0.06 mils of the total film thickness.

A polymeric sample approximately 11" long by 15.5" wide was placed on the substrate holder plate attached to the second electrode and described above in Example 1.

The chamber was pumped down to about 1 mTorr. An acetylene/argon gas mixture was then introduced into the chamber at a flow rate of 60 sccm, approximately 83% of the mixture being acetylene. The pressure within the chamber was increased to a reaction pressure of about 100 mTorr by use of a gate valve located at the inlet of the vacuum pump. A primary frequency of 13.5 MHz at a power level of 100 watts was applied to the first electrode and a secondary frequency of 95 kHz at a power level of 25 watts was applied to the second electrode.

The substrate was coated for approximately 60 seconds. Thereafter, the gas mixture was shut off and the chamber was pumped down again to about 1 mTorr. The chamber vacuum was then broken by bleeding in dry nitrogen gas and the respective coated substrate was removed.

The polymeric sample was thereafter tested. The sample film exhibited an oxygen transmission rate of 0.42 cc $O_2$/100 $in^2$/atm/24 hr at 23° C. and 0% relative humidity and a water vapor transmission rate of 0.024 g $H_2O$/100 $in^2$/atm/24hr at 100° F. and 90% relative humidity.

Additional polymeric samples were prepared under varying test conditions. The measured results from all of the polymeric samples, i e., samples 1–8, are set forth in the following table:

| SAMPLES | TO$_2$ | WVTR | PRESSURE (mtorr) | FLOW C2H2 | FLOW Ar | PRIMARY POWER (watts) | SECONDARY POWER (watts) | TIME (sec.) |
|---|---|---|---|---|---|---|---|---|
| Control 1 | 0.4 | 0.02 | 100 | 70 | 30 | 100 | 25 | 300 |
| Control 2 | 0.6 | 0.09 | 100 | 70 | 30 | 100 | 25 | 300 |
| Sample 1 | 0.42 | 0.024 | 100 | 50 | 10 | 100 | 25 | 60 |
| Sample 2 | 0.18 | 0.005 | 100 | 50 | 10 | 50 | 25 | 60 |
| Sample 3 | 0.11 | 0.015 | 100 | 50 | 10 | 75 | 25 | 60 |
| Sample 4 | 0.10 | 0.024 | 100 | 50 | 10 | 75 | 25 | 45 |
| Sample 5 | 0.18 | 0.020 | 100 | 50 | 10 | 75 | 25 | 30 |
| Sample 6 | 0.26 | 0.062 | 100 | 50 | 10 | 75 | 25 | 15 |
| Sample 7 | 0.07 | 0.036 | 150 | 50 | 10 | 75 | 25 | 30 |
| Sample 8 | 0.09 | 0.051 | 100 | 50 | 10 | 50 | 25 | 30 |

TO$_2$: cc/100 in$^2$/atm/24 hr at 23° C. and 0% R.H.
WVTR: g/100 in$^2$/atm/24 hr at 100° F. and 90% R.H.
FLOW: Standard cubic centimeter (sccm)

It is readily apparent from the test data set forth above that a barrier film can be produced by the deposition of carbon on an exposed high energy surface of an amorphous nylon layer. It is particularly significant that the rate of producing such a barrier film can be increased by approximately a factor of 10, i.e., the coating time is decreased from approximately 300 seconds to about 15 to 60 seconds. It is also significant that the resultant film exhibits a markedly decreased rate of oxygen transmission, while improving, or at the minimum maintaining, the level of water transmission.

Thus, while there have been described what are presently believed to be the preferred embodiments of the invention, those skilled in the art will realize that various changes and modifications may be made to the invention without departing from the spirit of such invention. All such changes and modifications which fall within the scope of the invention are therefore intended to be claimed.

What is claimed is:

1. A method for producing a polymeric film having barrier characteristics, comprising:

depositing a carbon coating on an exposed surface of an amorphous nylon layer by vapor deposition of a hydrocarbon gas in the presence of plasma, wherein said amorphous nylon layer is in adhered to a polymeric substrate.

2. The method according to claim 1, wherein said polymeric substrate is formed of a material selected from the group consisting of polypropylene, biaxial nylon, polyester and polyethylene.

3. The method according to claim 2, wherein said hydrocarbon gas comprises a hydrocarbon having between 1 to 20 carbon atoms.

4. The method according to claim 3, wherein said hydrocarbon comprises acetylene.

5. A method for increasing the production rate of a barrier film, comprising:

adhering an amorphous nylon layer having at least one exposed surface to a polymeric substrate; and thereafter depositing a carbon coating on said exposed surface of said amorphous nylon layer by vapor deposition of a hydrocarbon gas in the presence of plasma.

6. The method according to claim 5, wherein said nylon layer is co-extruded with said polymeric substrate.

7. The method according to claim 5, wherein said depositing step includes the step of:

applying a primary frequency of about 13.5 MHz to a first electrode positioned in a reaction chamber to generate said plasma and a secondary frequency of about 90 kHz to about 450 kHz to a second electrode positioned in said reaction chamber to facilitate deposition of said carbon coating on said exposed high energy surface.

8. The method according to claim 7, wherein said second electrode includes a substrate holder plate; and, further comprising the step of positioning said nylon layer on said substrate holder for receipt of said carbon coating on said exposed high energy surface.

9. The method according to claim 5, wherein said polymeric substrate is formed of a material selected from the group consisting of polypropylene, biaxial nylon, polyester and polyethylene.

10. The method according to claim 5, wherein said hydrocarbon gas comprises a hydrocarbon having between 1 to 20 carbon atoms.

11. The method according to claim 10, wherein said hydrocarbon comprises acetylene.

* * * * *